April 12, 1966 F. B. HUGLE 3,246,214

HORIZONTALLY ALIGNED JUNCTION TRANSISTOR STRUCTURE

Filed April 22, 1963

INVENTOR.

FRANCES B. HUGLE

BY Harry R. Lubcke

AGENT

United States Patent Office 3,246,214
Patented Apr. 12, 1966

3,246,214
HORIZONTALLY ALIGNED JUNCTION TRANSISTOR STRUCTURE

Frances B. Hugle, Santa Clara, Calif. (% Siliconix Inc., 1140 W. Evelyn Ave., Sunnyvale, Calif.)
Filed Apr. 22, 1963, Ser. No. 274,424
11 Claims. (Cl. 317—235)

Figure 1:
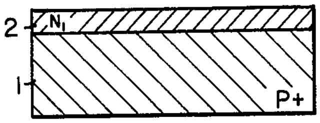

My invention relates to semiconductor transistor devices and particularly to the juxtaposition of the elements thereof for improving electrical response.

It is recognized that the unified structure of semiconductor devices frequently imposes performance limitations upon them. One example is the existence of relatively high series resistance in the base electrode of a transistor. This limits operation of the transistor at high frequencies; particularly in the range known as the ultra-high radio frequencies, extending above one gigacycle ($10^9$ cycles per second).

The base area is relatively lightly doped and thus has relatively high resistance, of the order of several ohms, whereas the highly doped emitter and epitaxial collector have resistances orders of magnitude smaller.

It will be recalled that known transistor structures are vertically disposed as to the actual working interfaces when the wafer thereof is horizontally positioned.

I have been able to form a new structure in which the interfaces are between elements which are horizontally disposed. This is accomplished by forming the base of two concentrations of doping; lightly doped in a small and annular shaped part of the element which carries the working interfaces and highly doped in the large supporting part of the element which also acts as the major body of the semiconductor structure. In effect, the working part of the structure is disposed horizontally, one element in relation to the other, atop the highly doped part of the base element.

The required structure is fabricated by forming a thin epitaxial layer upon the top of a wafer of the opposite type of semiconductor material. A layer of oxide is formed over that and a single hole is formed therein. By successive diffusions an annular ring which forms the active base element and an inner disk which forms the emitter element are produced. The ring becomes one with the wafer material beneath it, since it is formed of the same conductivity type as that substrate. Oxide is not grown during the base diffusion so that the emitter is diffused through exactly the same opening and the base thickness in the horizontal direction is analogous to the vertical base dimension in a conventional double diffused transistor.

An object of my invention is to provide a semiconductor device of the transistor class which is operative at ultra-high radio frequencies.

Another object is to provide a horizontal rather than a vertical transistor structure.

Another object is to provide a transistor in which the gain for small signal amplitudes is relatively high.

Another object is to provide a transistor in which the series resistance of the base electrode is low.

Another object is to provide a transistor device in which the external leads may be taken from only one side thereof.

Another object is to make a connection to a transistor element of small dimensions by employing an intermediary of semiconductor material.

Other objects will become apparent upon reading the following detailed specification and upon examining the accompanying drawings, in which are set forth by way of illustration and example certain embodiments of my invention.

Figure 2:
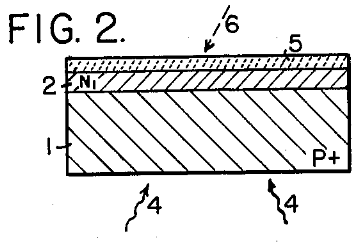
Figure 3:
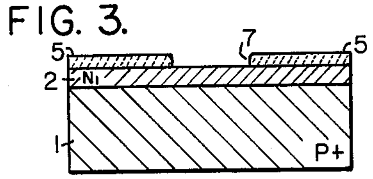
Figure 4:
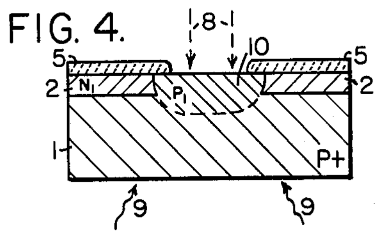
Figure 5:
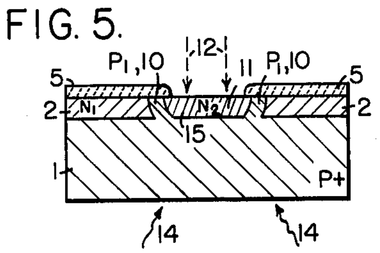
Figure 6:
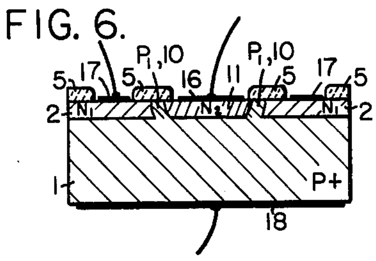
Figure 7:
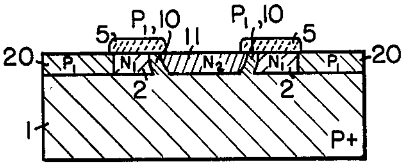
Figure 8:
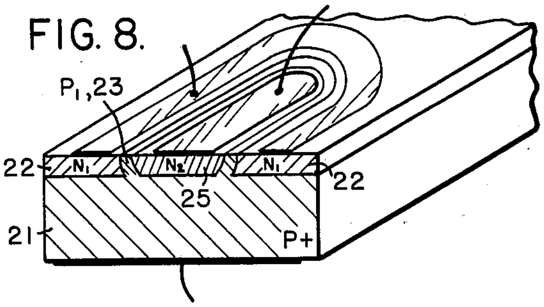
Figure 9:
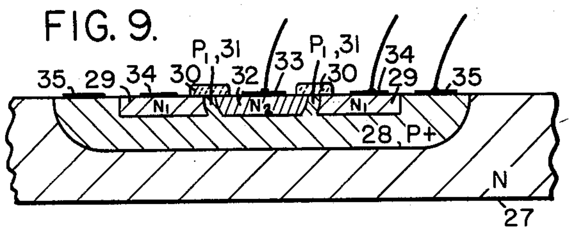
Figure 10:
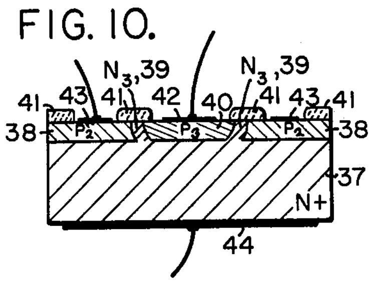

FIG. 1 is a sectional elevation view of a piece of semiconductor having an upper layer of opposite type and of doping level suitable for a collector, FIG. 2 is the same during the formation of oxide thereover, FIG. 3 is the same showing the results of photo-etching, FIG. 4 is the same during the base diffusion step, FIG. 5 is the same during the emitter diffusion step, FIG. 6 shows the completed transistor, with ohmic contacts, FIG. 7 shows an alternate construction to FIG. 5, which includes a third diffusion step, or, by suitable masking results from the diffusion step of FIG. 4, FIG. 8 shows an alternate construction to that of FIG. 6, in perspective, in which the structure is elongated for power handling purposes, FIG. 9 shows an alternate construction to that of FIG. 6, in which all connections are made at the top surface of the semiconductor structure, and FIG. 10 shows an alternate construction to FIG. 6 in which the types of semiconductor have been interchanged in the respective elements.

In FIG. 1 numeral 1 indicates a piece of semiconductor material; silicon for the purposes of this explanation. This is shown as a piece of a wafer, although a full wafer with a multiple of such pieces may be processed and the individual pieces separated later.

In FIG. 1 the symbol P+ has been placed upon semiconductor piece 1, indicating highly doped P type silicon, for example. Such material has relatively very low resistance, as 0.005 ohm·cm., and may be formed by doping with a group III element impurity, such as boron, with the ratio of the order of one part of boron to $10^4$ parts of silicon. In this figure the growth of N type silicon as an epitaxial upper layer 2 is shown as completed. This layer has the doping level of the collector element of the transistor, a part of which layer later becomes the collector element. The doping level of this material is signified by the subscript "1"; i.e., $N_1$, and is essentially two orders of magnitude less than that which forms the emitter subsequently. It is also essentially $\frac{1}{100}$ of the doping level of the P+ material.

In FIG. 2 a refractory coating 5, such as silicon oxide, is being formed on the work piece of FIG. 1. This is accomplished by exposing the semiconductor surface to steam, as indicated by the dotted inclined arrow 6, in the presence of oxygen and at an elevated temperature of the whole, as indicated by arrows 4. Other equivalent methods of obtaining this oxide may be employed, as may a nitriding process to give silicon nitride. The requirement for coating 5 is that it be refractory at semiconductor diffusion temperatures and that it be etchable.

In FIG. 3 the refractory layer has been provided with a hole 7, of the order of 0.001 inch diameter or less, by means of photo-resist techniques. To accomplish this the upper surface of refractory coating 5 is coated with a known photo-resist and a film, transparent save for one small area, say circular and of a diameter of 0.001", is placed over the photo-resist and the same exposed with ultra-violet light. The photo-resist is then developed, which removes the same under the 0.001″ opaque area of the film. With an etch such as hydrofluoric acid the oxide layer 5 is removed from that area. This produces the hole 7 of FIG. 3.

The work is now prepared for the double diffusion steps to be successively accomplished through the same hole, as shown in FIGS. 4 and 5.

In FIG. 4, by the impingement of the vapor of a group III element, say boron, a "saucer" by P type silicon is formed below and under the oxide layer 5 as shown. It is important that oxygen be absent during this process, otherwise a structure other than that desired eventuates. This diffusion produces $P_1$ semiconductor material, which has a doping level of intermediate value between the $N_1$ material for the collector previously formed in FIG. 1 and the $N_2$ material for the emitter to be formed according to FIG. 5. In general, the doping level of the $N_2$ material is two orders higher (100 times greater) than the $N_1$ material and the $P_1$ material is one order higher (10 times greater) than the $N_1$ material.

It is to be noted that the $P_1$ diffusion 10 extends under the edges of coating 5 in FIG. 4 by virtue of the inherent mechanism of the diffusion process. The process is carried on until it extends definitely beyond the $N_1$ layer 2 and into P+ layer 1, making a bond with the latter and thus forming a condition allowing continuous electrical conduction regardless of the fact that the degree of conductivity is one order different between the two P materials.

In FIG. 4 the impingement of the boron vapor is indicated by the dotted vertical arrows 8 and the accompanying heat by the wavy arrows 9. This processing is accomplished in a furnace known to the art, which is maintained at a temperature within the range of 900 to 1,300° C.

In FIG. 5 a second diffusion is made through the same aperture 7 of FIG. 3. This diffusion forms emitter 11. It is accomplished by impinging the vapor of a group V element of the Periodic Table, such as phosphorus, upon the previously diffused $P_1$ material, as indicated by dotted arrows 12 while maintaining the work at a temperature of the order of 1,000° C., as indicated by the wavy arrows 14, in a known furnace. The diffusion is carried forward to produce $N_2$ silicon, having a doping level two orders of magnitude greater than the original $N_1$ material 2 (that is, a doping level 100 times greater) and also to the extent that the $N_2$ material extends to or just beyond the original boundary between the $N_1$ and the P+ materials at 15. Since the P+ substrate and the N+ emitter are both highly doped, the emitter base junction will not move as rapidly into the substrate as it does into the top epitaxial layer.

FIG. 6 shows the complete transistor in vertical section, including ohmic contacts. The latter may be of gold alloyed to the transistor in the known manner. Emitter ohmic contact 16 has the shape of a small disk and a diameter of less than 0.001″, collector ohmic contact 17 has the shape of a ring and a diameter of the order of 0.002″, while the base ohmic contact 18 has the shape of a disk of the order of 0.003″ diameter and extends over substantially all of the base material 1 in order to provide a low resistance connection.

Etching of oxide coating 5 is required to allow the ring contact 17 to the collector to make contact with the same. This is accomplished by known photo-resist techniques in the same way as hole 7 of FIG. 3 was formed.

In transistors intended for high frequency operation it is desirable to minimize capacitances between all of the elements thereof. In FIGS. 5 and 6 the emitter capacitance to other elements is minimized by the small size of the emitter. However, the collector to base capacitance has not been minimized. The common extent of elements 2 and 1 is considerable. This extent can be markedly decreased by modifying the structure of FIG. 5 to that of FIG. 7. This calls for an additional diffusion of $P_1$ silicon into the area surrounding the net area required for collector 2. This is accomplished by forming another oxide coating over the whole top surface and engaging in an aditional photo-resist coating and exposure step in which a ring around the outer part of the whole structure is made devoid of photo-resist by a film having a suitable pattern, by exposure and by development as known. The extremes at left and right of oxide layer 5 are then etched away. FIG. 7 shows the process completed and the photo-resist and oxide layers removed, prior to the step of FIG. 6 in which ohmic contacts are attached.

With only the outer ring 20 exposed the $P_1$ diffusion is accomplished, as in FIG. 4 and according to the same technique.

In fact, it will be appreciated that the outer ring 20 may be diffused with $P_1$ material at the same time as the central $P_1$ formation takes place according to FIG. 4. This merely calls for a film having both the central dot and the surrounding ring opaque portions and then processing as has been indicated.

In any event, it is shown by the completed diffusion processing of FIG. 7 that the $N_1$ area 2 common to the P+ area 1 is greatly reduced and so is the capacitance between collector and base. The $P_1$ material 20 coalesces with the P+ 1 so that the area between the two that was formerly $N_1$ has been eliminated.

In FIG. 8 an alternate structure is shown in sectional perspective in which the several elements of the transistor are elongated in a front-to-back aspect, whereas in the earlier figures these were circular. This modification is made in order to increase the power-handling capability of the transistor.

The method of manufacture is the same as in the prior embodiment of FIG. 6. The additional $P_1$ zone of FIG. 7, zone 20, may also be included in the same way as before. The structure of FIG. 8 shows the semiconductor elements; gross base 21, working base 23, collector 22 and emitter 25. The protective oxide remaining over the junctions in FIG. 6 has not been shown for sake of clarity, but it is preferable to retain this oxide, since it performs the important function of protecting the junctions from contamination, moisture, etc. during the life of the transistor.

Since the working volumes of the transistor of FIG. 8 may be increased several times over the corresponding volumes in FIG. 6, the power capability of the former device of FIG. 8 may be in the tens of watts range. High frequency operation at relatively high power is sought-after in the applications of transistors to electronic technology.

In various embodiments of semiconductor devices in electronic technology the integrated circuit technique is employed. In this technique more than one transistor, diode, capacitor and/or resistor is formed in one wafer of semiconductor material, such as the partially shown N silicon 27 of FIG. 9. In this way, minute circuits may be formed for logic gates, etc. at low and moderate frequencies of operation and for complete ultra-high frequency circuits for high frequency operation.

In FIG. 9 a "pad" 28 of P+ silicon is diffused into the gross N silicon wafer by the photo-resist and oxidizing preparation technique of FIG. 3 and by diffusion technique of FIG. 4, with the doping levels altered to give P+ diffusion instead of $P_1$, and so on as will be understood from the whole disclosure of this specification. Similarly, the whole transistor structure comprised of collector 29, oxide coating 30, $P_1$ base 31, emitter 32, emitter ohmic contact 33, is formed as previously described.

As an alternate, N silicon may be diffused into the silicon all around the P pad to give the structure of FIG. 9. This is normally accomplished by growing a P+ layer on top of an N layer epitaxially and then using N type diffusion to separate the P+ pads.

With this kind of integrated circuit embodiment all connections to the transistor thereof must be made on one side of the wafer. None of the transistor elements extend through to the other side of the wafer. Accordingly, pad 28 in FIG. 9 is formed large enough to accomodate placement of ohmic contact 35 so as to surround the transistor structure per se. This contact is made in the same manner as has been previously described for other ohmic contacts.

All of the description thus far has pertained to the NPN type of transistor. My invention is equally applicable to the PNP type. This type is shown in FIG. 10. This illustration is other wise the equivalent of FIG. 6.

Specifically, the initially employed piece of semiconductor is of the N+ type indicated by numeral 37. Collector 38 has $P_2$ doped material, which is the lowest doping level of this structure. The $N_3$ active base diffusion 39 has a doping level approximately one order greater than the $P_2$ material. The $P_3$ material of emitter 40 has the highest doping level; two orders higher than the $P_2$ material. The protective oxide is shown at 41 and the emitter ohmic contact at 42, the collector ohmic contact at 43 and the base ohmic contact at 44.

It will be understood that the doping levels employed in the embodiments of the transistors illustrated may be varied to give specific electrical properties according to the circuit application for which the transistor is intended. For instance, the actual doping levels employed are selected to give the desired compromise between emitter-base breakdown voltage and the emitter-base capacitance on the one hand and the transistor alpha (current gain) and series resistance of the base on the other hand. For a high doping level a low breakdown voltage characteristic is obtained, along with high capacitance; but with low series resistance and a high value of alpha.

It is to be noted that my construction avoids low gain for small signals because the voltage drop of the signal in the series resistance of the base is negligible. Since important transistor applications occur at low signal levels, this is a significant improvement.

While silicon has been chosen as the semiconductor material in the illustrative embodiments given, germanium may also be used, with due consideration to the chemistry, processing and temperatures required for this semiconductor material.

It will be understood that modifications may be made in the relative sizes and shapes of the elements of my structure and that variations in the processing procedure may be permitted without departing from the scope of my invention.

Having thus fully described my invention and the manner in which it is to be practiced, I claim:

1. A semiconductor structure operable at high radio frequencies comprising (a) an emitter of high conductivity of one type of semiconductor material having a first conductivity type impurity one valence group removed from that of said semiconductor material and of the order of one part of impurity to $10^4$ parts of semiconductor, (b) a first base of intermediate conductivity of semiconductor type opposite to that of said emitter having a second conductivity type impurity one valence group oppositely removed from that of said first impurity and of the order of one part of impurity to $10^5$ parts of semiconductor, said first base disposed directly adjacent horizontally in full conductive relation totally laterally surrounding said emitter and having a volume of only a small fraction of the volume of said emitter, (c) a single collector of low conductivity of semiconductor material of said one type and having a said first impurity of the order of one part of impurity to $10^6$ parts of semiconductor, said collector disposed adjacently in conductive relation to said first base and laterally surrounding it in the same way as said first base was disposed with respect to said emitter, (d) a second base of uniformly high conductivity of semiconductor material of type the same as the type of said first base, conductively joined with said first base, having a volume greatly in excess of said first base, and having a said second impurity of the order of one part of impurity to $10^4$ parts of semiconductor, the recited emitter, first base and collector formed from material common to said second base and horizontally contiguous one to the other on one side of the material of said second base in a symmetrical concentric structure.

2. The semiconductor structure of claim 1 in which (a) said one type of semiconductor is the N type, and (b) the impurity forming said N type is an element in the V group comprised of phosphorus, antimony and arsenic.

3. The semiconductor structure of claim 1 in which (a) said one type of semiconductor is the P type, and (b) the impurity forming said P type is an element in the III group comprised of boron, indium, gallium and aluminum.

4. The semiconductor structure of claim 1 in which (a) an additional electrode element of intermediate conductivity of semiconductor material of said opposite type is disposed adjacent to said collector on the side away from said emitter upon only the top of the material of said second base.

5. The semiconductor structure of claim 1 in which (a) said structure as a whole is formed as an entity in a still larger volume of semiconductor material of type opposite to that of said second base, and (b) external ohmic connections to the said emitter, second base and collector are made coplanarly to only one side of the material of said emitter, said second base and said collector and not through said larger volume of semiconductor material.

6. The semiconductor structure of claim 1 in which (a) said one type of semiconductor material is the donor type.

7. The semiconductor structure of claim 1 in which (a) said one type of semiconductor material is the acceptor type.

8. An ultra-high frequency NPN silicon transistor comprising (a) a centrally disposed shallow emitter of highly doped N silicon having a phosphorus impurity of the order of one part in $10^4$ parts of silicon, (b) a lightly doped shallow ring of P silicon having a boron impurity of the order of one part in $10^5$ parts of silicon, concentrically and fully laterally surrounding said emitter, said ring having a uniform thickness small with respect to the extent of said emitter, (c) a shallow collector of lightly doped N silicon having a phosphorus impurity of the order of one part in $10^6$ parts of silicon concentrically and fully laterally surrounding said lightly doped ring, (d) a base region of highly doped P silicon having a uniformly distributed boron impurity of the order of one part in $10^4$ parts of silicon, conjoined with said lightly doped ring, the recited emitter, ring and collector in intimate contact laterally in a single silicon structure horizontally disposed exclusively above and contiguous with said base region.

9. A PNP silicon transistor having the same structure as that of claim 8 in which the P and the N materials are interchanged.

10. A transistor according to claim 8 in which (a) a large area ohmic contact is made to said highly doped P silicon to provide low base resistance for ultra-high frequency electrical operation of said transistor.

11. An ultra-high frequency power transistor according to claim 8 in which (a) the configuration of the recited emitter, ring and collector is one of concentric ovals.

References Cited by the Examiner

UNITED STATES PATENTS

| | | | |
|---|---|---|---|
| Re. 25,473 | 11/1963 | Pfann | 317—235 |
| 2,787,564 | 4/1957 | Shockley | 317—235 |
| 2,792,540 | 5/1957 | Pfann | 317—235 |
| 2,810,870 | 10/1957 | Hunter et al. | 317—234 |
| 2,813,048 | 11/1957 | Pfann. | |
| 2,898,247 | 8/1959 | Hunter | 148—187 |
| 2,952,804 | 9/1960 | Franke | 317—235 |
| 2,954,307 | 9/1960 | Shockley | 317—234 |
| 2,971,140 | 2/1961 | Chappey et al. | 317—235 |
| 3,064,167 | 11/1962 | Hoerni | 317—234 |
| 3,089,794 | 5/1963 | Marinace | 148—175 |
| 3,100,276 | 8/1963 | Meyer | 317—234 |

FOREIGN PATENTS

| | | |
|---|---|---|
| 871,307 | 6/1961 | Great Britain. |

OTHER REFERENCES

Handbook of Semiconductor Electronics, edited by L. P. Hunter, McGraw-Hill, copyright 1956, pages 4–12 to 4–15.

JOHN W. HUCKERT, *Primary Examiner.*

JAMES D. KALLAM, DAVID J. GALVIN, *Examiners.*

A. M. LESNIAK, *Assistant Examiner.*